US 6,537,010 B2

(12) United States Patent
Martin et al.

(10) Patent No.: US 6,537,010 B2
(45) Date of Patent: Mar. 25, 2003

(54) WAFER BOAT SUPPORT AND METHOD FOR TWIN TOWER WAFER BOAT LOADER

(75) Inventors: John M. Martin, Mesa, AZ (US); Arthur W. Harrison, Mesa, AZ (US); Allen D. Edwards, Phoenix, AZ (US)

(73) Assignee: Amtech Systems, Incorporated, Tempe, AZ (US)

( * ) Notice: Subject to any disclaimer, the term of this patent is extended or adjusted under 35 U.S.C. 154(b) by 19 days.

(21) Appl. No.: 09/812,014

(22) Filed: Mar. 19, 2001

(65) Prior Publication Data

US 2001/0041118 A1 Nov. 15, 2001

Related U.S. Application Data

(63) Continuation-in-part of application No. 09/348,997, filed on Jul. 7, 1999, now Pat. No. 6,352,399.
(60) Provisional application No. 60/192,516, filed on Mar. 28, 2000.

(51) Int. Cl.[7] ............................................. B65G 25/04
(52) U.S. Cl. ..................... 414/156; 414/938; 414/940; 414/804; 414/806; 414/282; 414/280; 414/535; 118/500; 432/239
(58) Field of Search ................................ 414/280, 156, 414/160, 281, 282, 277, 217, 217.1, 222.01, 935, 940, 804, 806, 937, 619, 663, 664, 668; 432/26, 32, 239; 118/500, 711

(56) References Cited

U.S. PATENT DOCUMENTS

| 4,405,277 A | 9/1983 | Bürkner et al. | ............. 414/222 |
| 4,669,938 A | 6/1987 | Hayward | ..................... 414/156 |
| 4,701,096 A | 10/1987 | Fisher, Jr. | .................... 414/416 |
| 4,722,659 A | 2/1988 | Hoyt, III et al. | ............ 414/416 |
| 4,728,246 A | 3/1988 | Mello | ......................... 414/592 |
| 4,872,799 A | 10/1989 | Fisher, Jr. | ................... 414/180 |
| 4,888,994 A | 12/1989 | Nakamaki et al. | ............ 73/760 |
| 4,954,079 A | 9/1990 | Yamaga | ......................... 432/6 |
| 5,032,053 A | 7/1991 | Krieg | ......................... 414/278 |

(List continued on next page.)

FOREIGN PATENT DOCUMENTS

| FR | 2587692 | * | 3/1987 | ................. 414/282 |
| JP | 0128523 | * | 6/1987 | ................. 414/156 |
| JP | 62-128523 | * | 6/1987 | ................. 414/156 |
| JP | 63-142630 | * | 6/1988 | ................. 414/156 |
| JP | 4-62859 | * | 2/1992 | ................. 414/940 |
| WO | 094004447 | * | 3/1994 | ................. 414/282 |

*Primary Examiner*—Frank E. Werner
(74) *Attorney, Agent, or Firm*—Cahill, von Hellens & Glazer P.L.C.

(57) ABSTRACT

An apparatus for automatically and simultaneously loading/unloading a plurality of wafer boats (24) onto/from a cantilever paddle includes a cantilever paddle (47-1) and a carriage (42-1) supporting the cantilever paddle First and second vertical translation mechanisms (34A,B) each include a stationary part (62,63) and a vertically moveable support (61). First and second horizontal translation mechanisms (50A,B) each have a base (86) supported by one of the vertically moveable supports and a horizontally moveable arm (51) supported by the base (86). A horizontal boat support assembly (102) supports the loaded wafer boats and has an end supported by a first horizontally moveable arm (51A) and another end supported by a second horizontally moveable arm (51B). A stationary rail (97) has its ends supported by the first and second horizontally moveable arms, and a moveable rail (96) is supported by outer ends of first and second rotary arms to bring the moveable rail into a lower first position to engage an edge of each of the wafer boats (24) and to an upper second position above wafers in the wafer boats to clear the wafers as the first and second horizontal translation mechanisms are withdrawn from the wafer boats (24).

13 Claims, 12 Drawing Sheets

U.S. PATENT DOCUMENTS

| | | | |
|---|---|---|---|
| 5,069,591 A | * 12/1991 | Kinoshita | 414/156 |
| 5,131,799 A | 7/1992 | Nishi et al. | 414/416 |
| 5,284,412 A | 2/1994 | Shiraiwa et al. | 414/277 |
| 5,356,261 A | 10/1994 | Nishi | 414/404 |
| 5,374,153 A | 12/1994 | Nishi | 414/417 |
| 5,405,232 A | * 4/1995 | Lloyd et al. | 414/280 |
| 5,409,348 A | 4/1995 | Suzuki | 414/786 |
| 5,501,564 A | 3/1996 | Doche | 414/331 |
| 5,547,537 A | 8/1996 | Reynolds et al. | 156/351 |
| 5,611,422 A | 3/1997 | Harkonen | 198/681 |
| 5,634,760 A | * 6/1997 | Anderson et al. | 414/277 X |
| 5,636,724 A | 6/1997 | Scheler et al. | 198/375 |
| 5,765,982 A | 6/1998 | Martin et al. | 414/156 |
| 5,839,870 A | * 11/1998 | Niemirowski et al. | 414/156 X |
| 5,947,676 A | * 9/1999 | Richard | 414/535 |
| 6,352,399 B1 | * 3/2002 | Martin et al. | 414/156 |

* cited by examiner

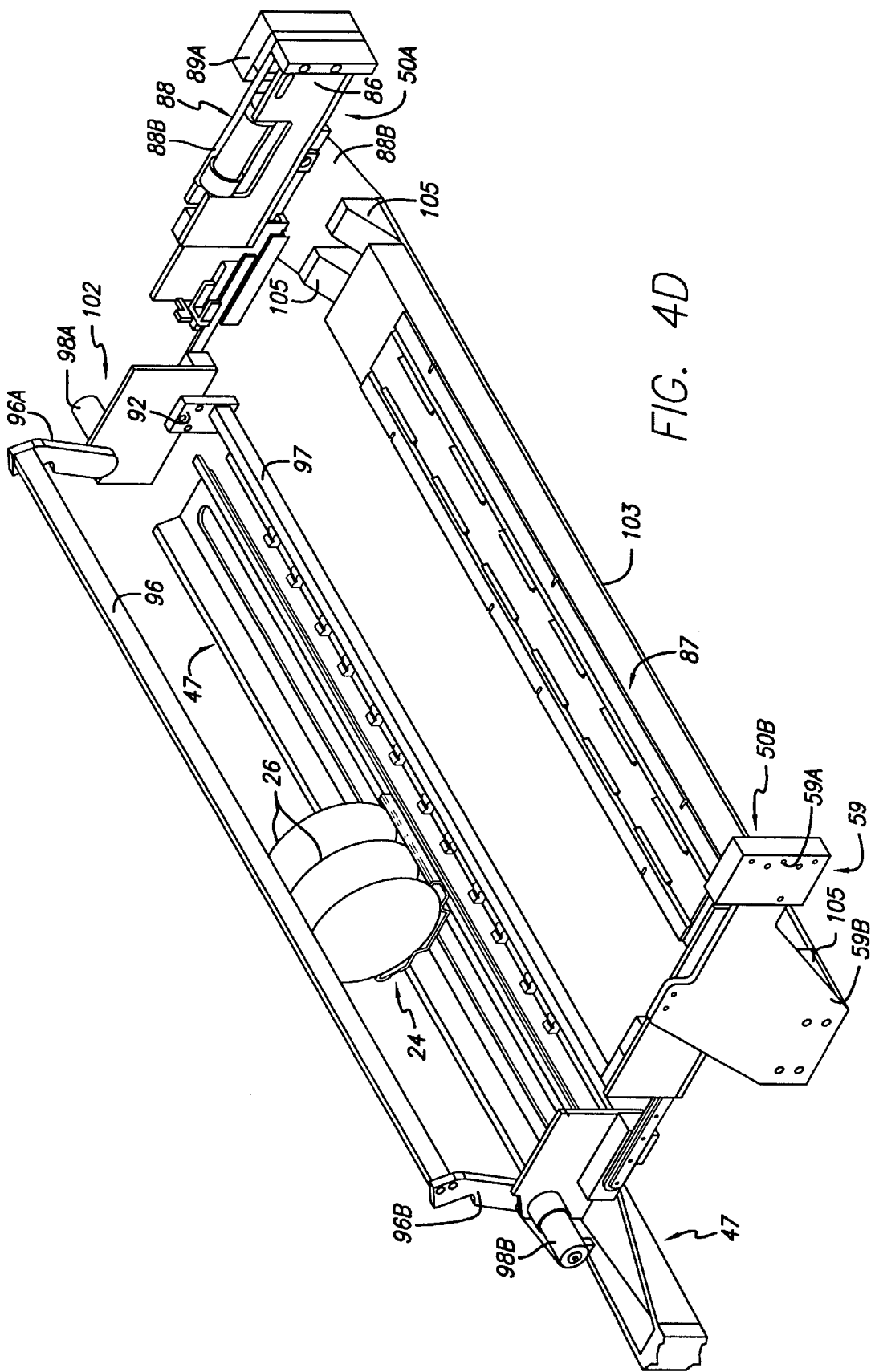

WAFER BOAT SUPPORT AND METHOD FOR TWIN TOWER WAFER BOAT LOADER

CROSS REFERENCE TO RELATED APPLICATION

This application is a continuation-in-part of commonly assigned patent application entitled "TWIN TOWER B OAT LOADING SYSTEM AND METHOD", filed on Jul. 7, 1999, Ser. No. 09/348,997, issued as patent 6,352,399 on Mar. 5, 2002, incorporated herein by Reference, by inventors John M. Martin and Arthur W. Harrison.

This application also claims the benefit of prior filed U.S. provisional application Ser. No. 60/192,516 filed Mar. 28, 2000 entitled "TWIN TOWER BOAT LOADING SYSTEM AND METHOD" by John M. Martin, Arthur W. Harrison and Allen D. Edwards.

BACKGROUND OF THE INVENTION

The invention relates to a system for automatically and simultaneously loading a plurality of boat loads of semiconductor wafers into a semiconductor diffusion furnace.

Commonly assigned U.S. Pat. No. 5,765,982 by Martin et al., issued Jun. 16, 1998 is incorporated by reference herein, and is believed to be representative of the closest prior art. FIG. 1A of U.S. Pat. No. 5,765,982 shows a furnace loading station 10. A queue mechanism 30 having a stationary base is loaded with up to eight boatloads of semiconductor wafers 26. The queue mechanism 30 shifts the right hand boatload of wafers to an index position at the right end of queue mechanism 30 such that a pair of horizontal elevator tines 38 of a vertical elevator mechanism 34 can pick up one boatload of wafers at a time in the manner of a fork lift, raise them upward in the direction of arrows 60 into alignment with one of a number of horizontal loading assemblies such as 14 and 16. Each loading assembly includes a carriage such as 20 or 42 which moves horizontally on a track toward a semiconductor furnace tube located in a furnace cabinet on the right hand side of furnace loading station 10 so that up to eight boatloads of wafers supported on either a horizontal cantilever paddle such as 47 or in a horizontal cantilever diffusion tube such as 21 can be inserted into the hot zone of a corresponding furnace tube.

A horizontal robotic mechanism 37 is supported by vertical elevator 34. Horizontal robotic mechanism 37 supports the tines 38 which pick up one boatload of wafers and moves them horizontally in the direction of arrows 39 to position each boatload of wafers, one at a time, over the paddle 47, lower it onto the paddle 47. After up to eight boatloads of wafers have been loaded onto cantilever paddle 47, the carriage 42 supporting the paddle 47 moves in the direction of arrow 59 into the hot zone of the corresponding furnace tube. The entire operation is controlled by a programmed computer or control system 29 that controls the various described moving mechanisms.

A major shortcoming of the foregoing system of U.S. Pat. No. 5,765,982 is that the process of loading and unloading each cantilever paddle 47 with up to eight boatloads of wafers one at a time, inserting them all at once into and withdrawing them all at once from the furnace tube, the unloading of the processed boatloads of wafers, one at a time, and depositing them back on the queue mechanism 30 is very time-consuming. A typical prior art loading station 10 includes four loading assemblies such as 16, so 24 to 32 boatloads of wafers have to be transferred one at a time from queue mechanism 30 and loaded one at a time onto the cantilever paddles 47 prior to processing them in the furnace tube. After processing they then must be unloaded from paddles 47 one at a time and returned to queue mechanism 30. This may require a total of more than 15 minutes. The mechanism 30 in U.S. Pat. No. 5,765,982 is undesirably complex and slow.

Other prior art exists which provides an intermediate carrier that can support up to eight boatloads of wafers and load all up to eight boatloads in a single pass onto a cantilever paddle such as 47 in U.S. Pat. No. 5,765,982. Most such prior art systems use complex 5-axis articulated mechanisms to support the intermediate carrier and the up to eight boatloads of wafers on it. Both the hardware and software of these systems are more complex and expensive than is desirable. It is desirable that improvements to a wafer boat loading system occupy a minimum amount of space during operation and also be physically durable, in order to minimize amount of extremely expensive floor space required by a new wafer boat loading system in a new semiconductor fab unit, and to make the improvements easily retrofittable to an existing wafer boat loading system already installed in a wafer fab unit.

SUMMARY OF THE INVENTION

Accordingly, it is an object of the invention to provide an automatic wafer boat loading system which reduces the amount of time required to load a plurality of boatloads of semiconductor wafers into a semiconductor diffusion furnace and to later unload them from the furnace.

It is another object of the invention to provide an automatic wafer boat loading system which requires a minimum amount of space in which to operate.

It is another object of the invention to provide an improved automatic wafer boat loading system which includes a mechanically strong, stable boat handling apparatus and occupies a minimum amount of space during operation.

It is another object of the invention to provide an automatic wafer boat loading system which avoids the need for separate operations to load a plurality of wafer boats, one at a time, onto a cantilever paddle.

It is another object of the invention to provide an automatic wafer boat loading system which avoids generation of particulates due to abrasion that results from imprecise placement of loaded wafer boats on a cantilever paddle.

It is another object of the invention to provide an automatic wafer boat loading system which reduces the number of loading and unloading cycles required to load a plurality of boatloads of wafers into a diffusion furnace and later unload them from the furnace.

It is another object of the invention to provide an automatic wafer boat loading system which is operable using relatively simple software.

It is another object of the invention to provide a system for simultaneously loading a plurality of boatloads of wafers into a furnace tube while introducing a reduced amount of thermal mass and physical mass into the furnace tube so as to avoid disturbing semiconductor process parameters within the furnace tube by eliminating the need to use an intermediate carrier.

Briefly described, and in accordance with one embodiment thereof, the invention provides an apparatus for automatically and simultaneously loading a "long" wafer boat or a plurality of wafer boats onto a cantilever paddle, and automatically and/or simultaneously unloading the loaded wafer boats from the cantilever paddle. A stationary first track (16-1,43) is aligned with a first opening of a furnace, and a first carriage (42-1) is moveable on the first track, the first carriage (42-1) supporting the first cantilever paddle (47-1). The apparatus includes a first vertical translation mechanism (34A), a second vertical translation mechanism (34B), a first horizontal translation mechanism (50A) supported by the first vertical translation mechanism (34A), and a second horizontal translation mechanism (50B) supported by the first vertical translation mechanism. The first vertical translation mechanism (34A) includes a first stationary part (62A,63A) and a first vertically moveable support (61A), and the second vertical translation mechanism (62B,63B) includes a second stationary part (62B,63B) and a second vertically moveable support (61B). The first horizontal translation mechanism (50A) has a first base (86) supported by the first vertically moveable support (61A). The first horizontal translation mechanism includes a first horizontally moveable arm (51A) supported by the first base (86). The second horizontal translation mechanism has a second base supported by the second vertically moveable support, and includes a second horizontally moveable arm (51B) supported by the second base. A horizontal support apparatus (102) is adapted to support a plurality of wafer boats (24) each loaded with semiconductor wafers (26). The horizontal support apparatus (102) has a first end supported by the first horizontally moveable arm (51A) and a second end supported by the second horizontally moveable arm (51B). A stationary wafer boat edge lift member (97) has a first end rigidly supported by the first horizontally moveable arm (51A) and a second end rigidly supported by the second horizontally moveable arm (51B). A moveable wafer boat edge lift member (96) has a first end supported by and in moveable relationship to the first horizontally moveable arm (51A) and a second end supported by and in moveable relationship to the second horizontally moveable arm (51B). The moveable wafer boat edge lift member (96) includes first and second end portions supported by outer ends of first (97A) and second (97B) rotary arms, respectively, having inner end portions supported by first and second rotary drives supported by the first and second horizontally moveable arms, respectively. In the described embodiment, the first and second rotary drive mechanisms rotate the rotary arms to bring the moveable wafer boat edge lifting member (96) into a lower first position to engage an edge of a wafer boat (24) and to an upper second position above the wafers (26) in the wafer boat (24) so as to clear the wafers (26) as the first (50A) and second (50B) horizontal translation mechanisms are withdrawn from the wafer boat after they are set on the cantilever paddle.

BRIEF DESCRIPTION OF THE DRAWINGS

FIGS. 4A–4D constitute a succession of perspective views showing a support assembly supported by a horizontal translation mechanism during successive stages of the operation of loading a boatload of wafers onto a cantilever paddle of a wafer boat loading system.

DETAILED DESCRIPTION OF THE PREFERRED EMBODIMENTS

Figure 1A:
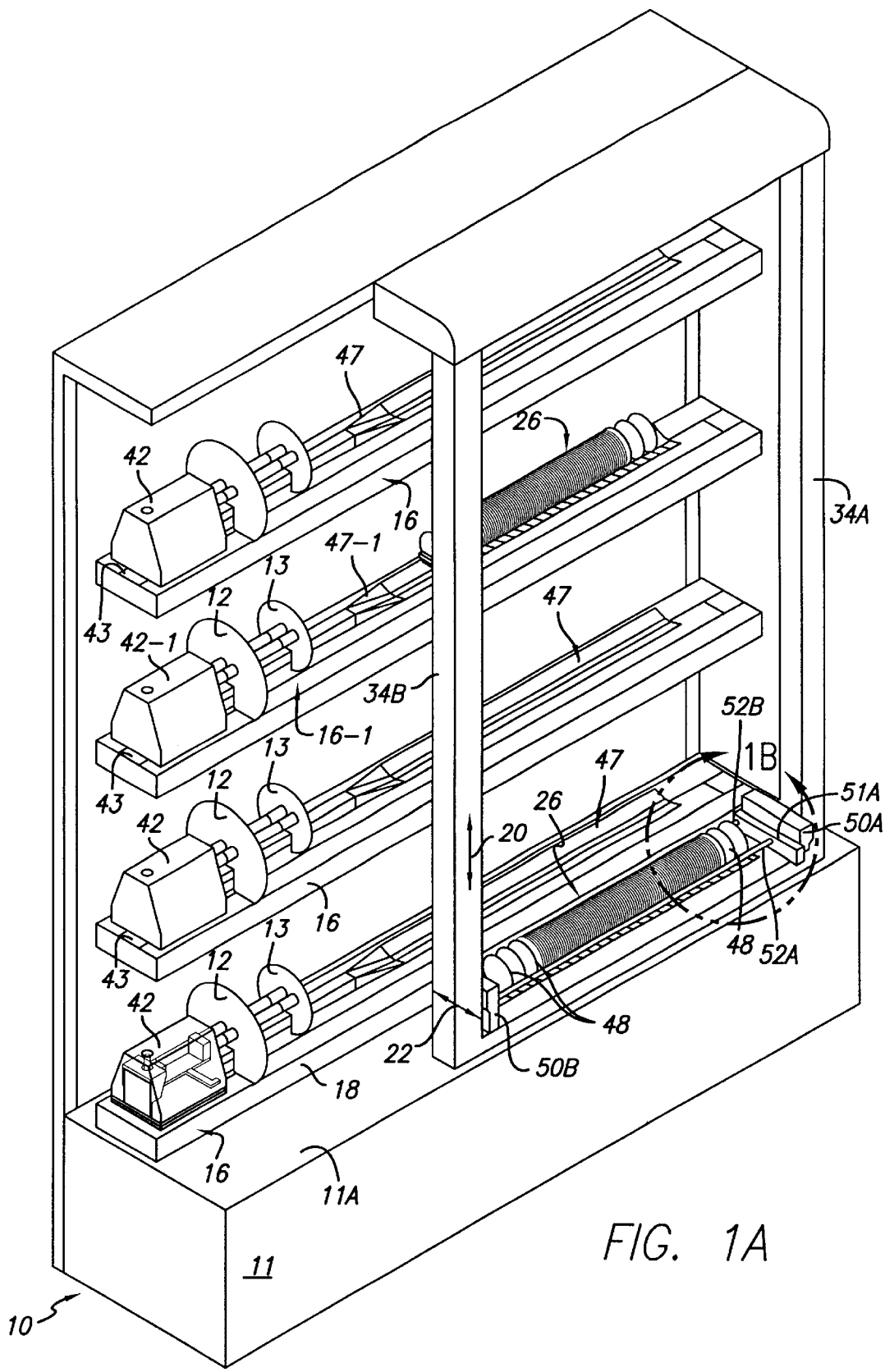
FIG. 1A is a perspective view of an automatic wafer boat loading system with a plurality of boatloads of wafers ready to be transported to and set down on one of a plurality of silicon carbide cantilever paddles.

Referring to FIGS. 1A–1F, automatic wafer boat loading station 10 includes four conventional loading mechanisms 16, similar to those described in above mentioned U.S. Pat. No. 5,765,982. Each loading mechanism 16 includes a carriage 42 horizontally moveable on a longitudinal track 43. Each loading mechanism 16 supports a horizontal cantilevered silicon carbide paddle 47 that supports up to eight "standard" wafer boats loaded with semiconductor wafers (i.e., about 150 to 300 wafers) along with additional cylindrical devices called "baffle boats". Baffle boats include baffle disks that are provided to establish the desired gas flow patterns and thermal patterns in the furnace tube. In FIG. 1A, a group of boatloads of semiconductor wafers 26 are shown on cantilever paddle 16-1, ready to be carried into the hot zone of a diffusion furnace tube by the cantilever paddle 47-1 and carriage 42-1. Another group of wafer boats loaded with semiconductor wafers 26 is shown loaded onto a subsequently described wafer boat transporting mechanism, and is ready to be loaded onto another one of the available cantilever paddles 47. The silicon carbide cantilever paddles 47 herein do not need to have a slot such as the one designated by numeral 47A in U.S. Pat. No. 5,765,982.

Alternatively, a single large wafer boat of the kind commonly referred to as a "long boat", rather than up to eight "standard" wafer boats can be supported on a cantilever paddle 47 and carried by it into the hot zone of the furnace tube. A typical "standard" wafer boat carries either 25 or 50 semiconductor wafers, and a typical "long boat" carries 150 or 300 semiconductor wafers.

Automatic wafer boat loading station 10 of FIGS 1A–1F includes two vertical elevator systems, rather than only one as in the prior art. In FIG. 1A, the two vertical elevator systems are designated by numerals 34A and 34B, and are also referred to as "vertical translation mechanisms" 34A and 34B, respectively.

Loading station 10 also includes two horizontal translation mechanisms 50A and 50B, which themselves are moveable vertically in the directions of arrows 20 by vertical elevator mechanisms 34A and 34B, respectively. Horizontal translation mechanisms 50A and 50B are also referred to as "Y-drives" 50A and 50B, respectively. Horizontal translation mechanisms 50A and 50B include horizontally moveable arms 51A and 51B, respectively, which each are moveable horizontally in the directions of arrows 22.

Figure 1B:
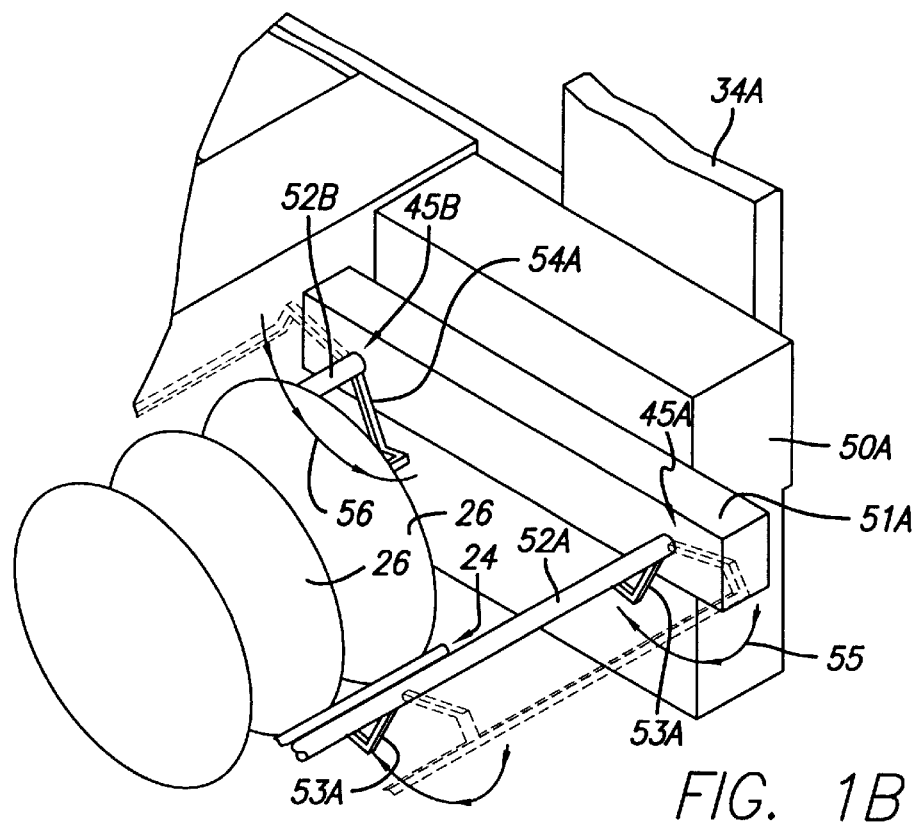
FIG. 1B is an enlarged perspective view of a portion of the system shown in FIG. 1.
Figure 1C:
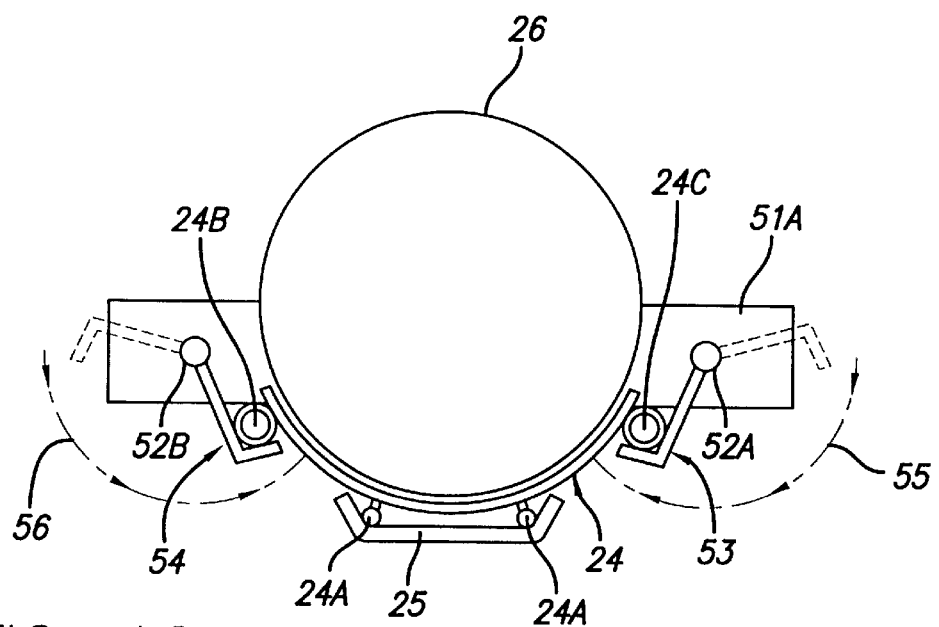
FIG. 1C is a partial section view useful in describing the operation of the system in FIG. 1A.
Figure 1D:
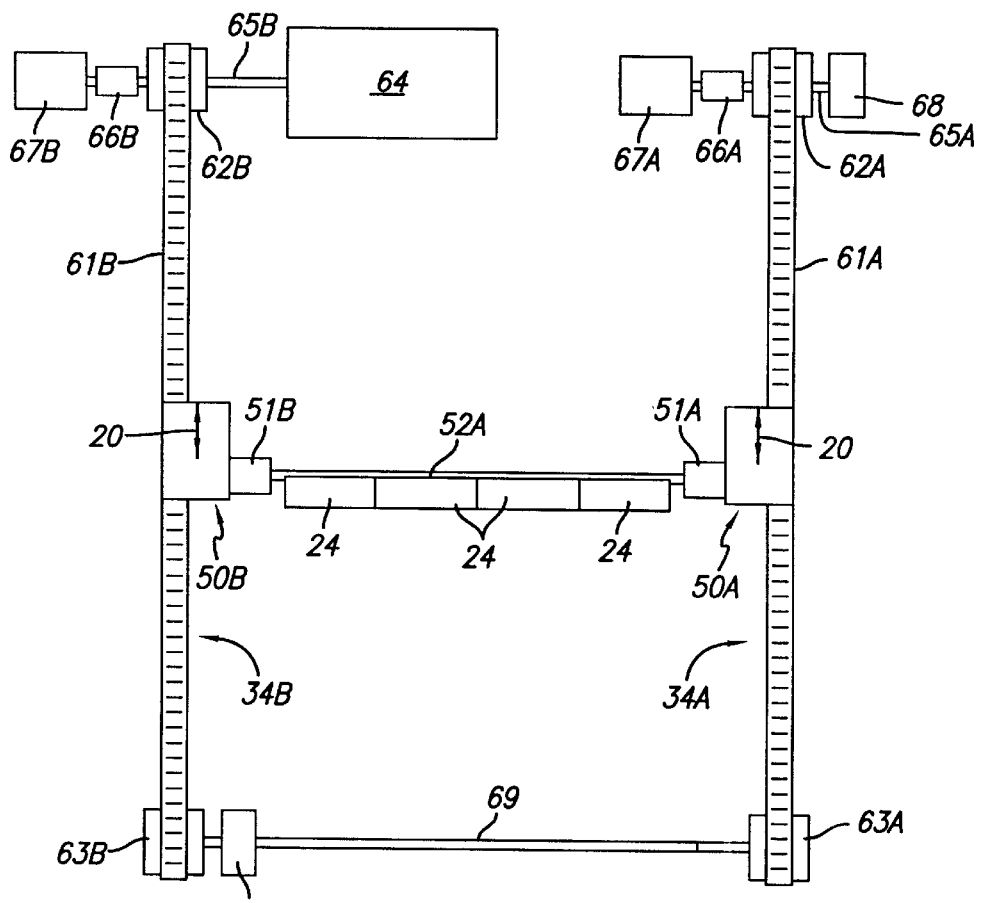
FIG. 1D is a simplified front elevational view of the drive mechanisms in the two elevators in FIG. 1A.

FIG. 1D illustrates the vertical translation mechanisms included in elevators 34A and 34B of FIG. 1A. Belt 61 A, idler pulleys 62A and 63A, encoder 68, over-running coupling 66A, and slip clutch 67A are included in elevator 34A. Similarly, vertical belt 61B, idler pulley 63B, encoder 70, drive pulley 62B, motor and drive assembly 64, over-running coupling 66B and slip clutch 67B are included in the vertical translation mechanism in elevator 34B.

Y-drive mechanism 50A is supported on belt 61A and is carried vertically in the directions of arrows 20. Drive pulley 62B is driven by motor and drive assembly 64 in response to control signals 29B from microcontroller 29 of FIG. 1G. Y-drive mechanism 50B is attached to belt 61B. Belt 61B is carried vertically in the directions of arrows 20 by drive pulley 62B and imparts an identical rotation to idler pulley 63B. Idler pulley 63B drives axle 69, which drives idler pulley 63A.

Figure 1E:
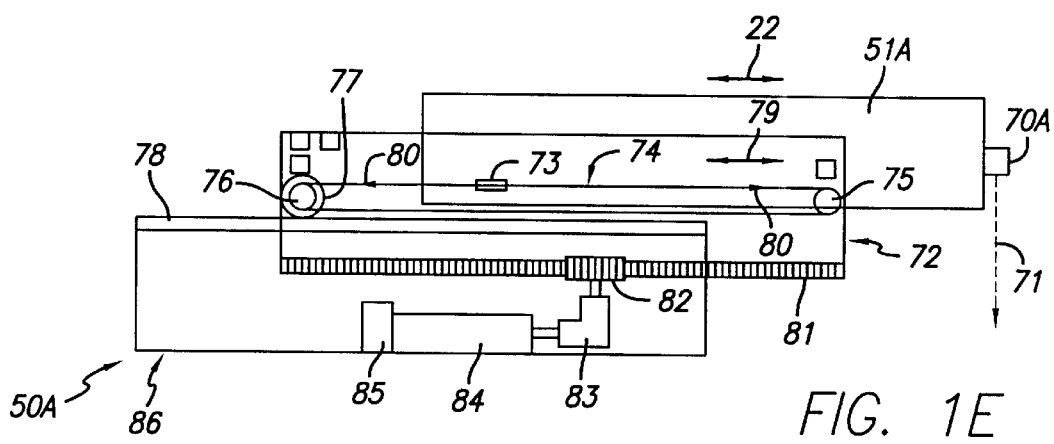
FIG. 1E is a simplified side elevational view of part of a Y-drive mechanism of a horizontal translation mechanism in FIG. 1A.

Rotary encoder 70 in FIG. 1E is connected to rotary axle 69 and provides, for example, 1000 equally spaced counts per inch of vertical movement of belt 61B, and generates corresponding signals on one of conductors 29A applied to the input of microcontroller 29. Belt 61A is driven by idler pulley 63A, to which horizontal translation mechanism 50A is attached. Belt 61A imparts the same rotation to idler pulley 62A, which turns rotary encoder 68. Encoder 68 provides 1,000 counts per inch of movement of belt 61A, and provides corresponding signals on one of conductors 29A as an input to microcontroller 29. Using such information, microcontroller 29 of FIG. 1G continuously monitors the vertical positions of Y-drives 50A and 50B and the horizontal positions of horizontally moveable arms 51A and 51B to ensure that the Y-drives 50A and 50B are at the same elevation.

Over-running couplings 66A and 66B together with adjustable slip clutches 67A and 67B perform the function of, in effect, "counter-balancing" the weight of the loaded wafer boats, Y-drive mechanisms 50A and 50B, and wafer boat support apparatus, which combined may weigh from about 30 pounds to about 50 pounds. That weight is supported by only one side of each of belts 61A and 61B, and needs to be offset to prevent excessive vertical drift of the 30 to 50 pounds supported by one side of belts 61A and 61B. (Note that instead of using axle 69 to translate rotation of idler pulley 63B to idler pulley 63A, axle 69 could be omitted, and axle 65B could be extended to be connected to axle 65A. Then only one clutch and one over-running coupling would be needed.)

In operation, over-running couplings 66A and 66B decouple adjustable slip-clutches 67A and 67B from rotary shafts 65A and 65B while the weight of Y-drives 50A and 50B and the wafer boats supported thereby are being lifted. When the Y-drives 50A and 50B and wafer boats supported thereby are being lowered, over-running couplings 66A and 66B connect shafts 65A and 65B to slip-clutches 67A and 67B, respectively, which then act as brakes to counter lowering of the weight of Y-drives 50A and 50B and the wafer boats supported thereby. This avoids the need for use of massive counterbalancing weights on the opposite sides of belts 61A and 61B from the Y-drives 50A and 50B.

Slip-clutch mechanisms 67A and 67B each include a stationary, non-rotational plate, and a rotary plate coupled to shaft 65A or 65B, by overrunning coupler 66A or 66B, respectively, and act as controllable friction brakes to offset the 30 to 50 pound weight on one side of belts 61A or 61B. Over-running couplings 66A and 66B thereby prevent the drift or back-rotation of pulleys 62A and 62B due to the weight of the mass connected to one side of each of belts 61A and 61B. Slip clutches are enclosed to contain any particulates generated by the friction therein.

Horizontal translation mechanisms 50A and 50B include wafer boat edge engaging mechanisms 45A and 45B, respectively, that typically lift up to eight conventional boats loaded with semiconductor wafers 26. Or, a single conventional long boat loaded with 150 or 300 semiconductor wafers could be engaged and lifted by wafer boat edge engaging mechanisms 45A and 45B. The wafer boat edge engaging mechanisms 45A and 45B also lift several baffle boats 48 at opposite ends of the group of up to eight boatloads of wafers (which are used to establish uniform process gas flow around the boatloads of wafers). Thus, the system including vertical elevators 34A and 34B and the two horizontal translation mechanisms 50A and 50B and associated wafer boat edge engaging mechanisms 45A and 45B can carry up to eight standard wafer boats (or one long boat) loaded with wafers and associated baffle boats to any of the four silicon carbide cantilever paddles 47 in a single pass.

Figure 1F:
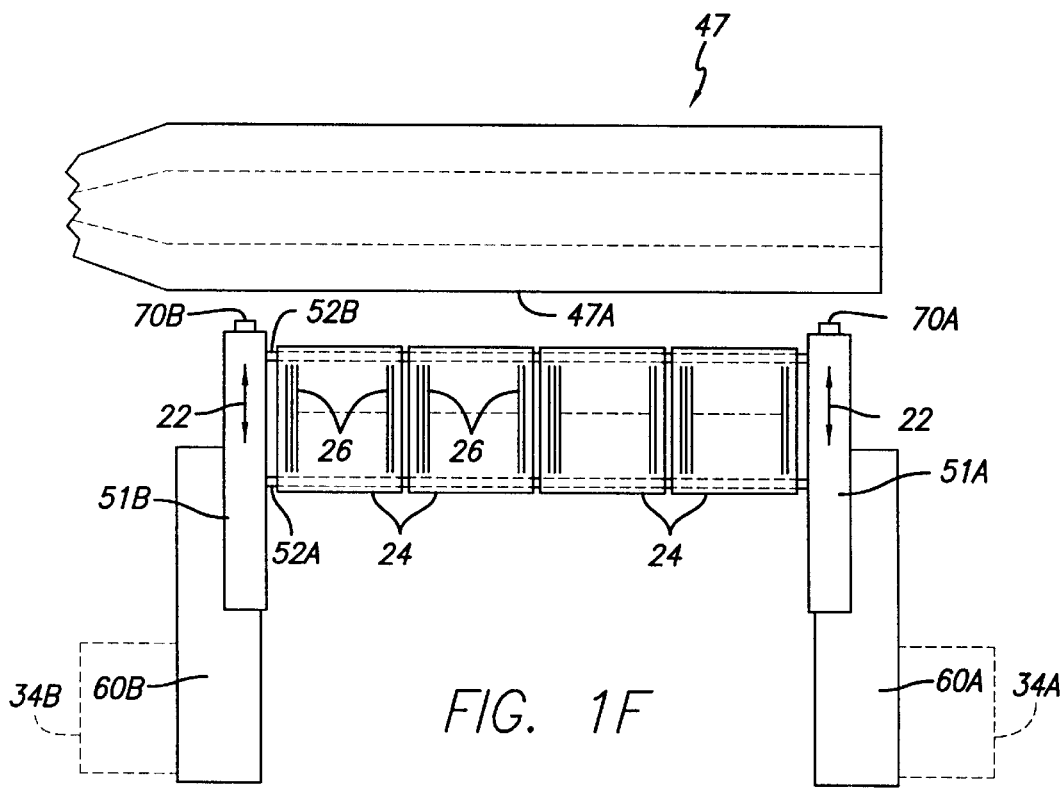
FIG. 1F is a plan view diagram illustrating the cantilever paddle edge sensors and operation used to simultaneously and automatically align a plurality of boatloads of semiconductor wafers with the cantilever paddle.

FIGS. 1E and 1F show partial detail of Y-drive or horizontal translation mechanism 50A, including horizontally moveable arm 51A. An optical sensor 70A is attached to the outer end of horizontally moveable arm 51A, and emits a beam 71 downward as indicated by the dotted line arrow 71. When the outer edge of horizontally moveable arm 51A passes over the front edge of cantilever paddle 47, beam 71 is reflected back to sensor 70A, which causes it to transmit a signal to programmed microcontroller 29. This, in conjunction with the signals produced by the encoder 85 of horizontal translation mechanism 50A, indicates precisely the location of horizontally moveable arm 51A at the time it moves over the front edge 47A of cantilever paddle 47, as shown in FIG. 1F.

A similar optical sensor 70B on the outer edge of horizontally moveable arm 51B senses the edge of cantilever paddle 47 and transmits a signal to microcontroller 29. This, in conjunction with the signals produced by encoder 85 of horizontal translation mechanism 50B, indicates precisely the location of horizontally moveable arm 51A at the time it moves over the front edge 47A of cantilever paddle 47, as shown in FIG. 1F.

Microcontroller 29 uses the positional information from the two encoders 85 of the two horizontal translation mechanisms and the edge sensors thereof to compute any offset correction needed to adjust the relative positions of horizontally moveable arms 51A and 51B as necessary to make the wafer boats held thereby precisely parallel to the longitudinal axis of cantilever paddle 47. Microcontroller 29 can use the information from sensors 70A and 70B and the positional information from encoders 85 of the two Y-drives 50A and 50B in various ways to accomplish accurate alignment of the wafer boats carried by horizontally moveable arms 51A and 51B with cantilever paddle 47 before lowering the wafer boats onto it. For example, microcontroller 29 can independently advance each of the horizontally moveable arms 51A and 51B the known precise amount of distance from the edge of cantilever paddle 47 to the longitudinal axis thereof. Or, microcontroller 29 can stop whichever horizontally moveable arm first reaches the edge of cantilever paddle 47, wait for the other one to catch up, and then advance them together into alignment with the horizontal axis of cantilever paddle 47.

Microcontroller 29 thus adjusts the relative positions of horizontally moveable arms 51A and 51B as they independently advance further over cantilever paddle 47 to the precise location along the Y direction at which up to eight wafer boats are to be loaded onto or unloaded from cantilever paddle 47. At that location the longitudinal axis of the cantilever paddle 47 is precisely aligned with the longitudinal axes of the up to eight wafer boats 24.

Still referring to FIG. 1E, horizontally moveable arm 51A is supported on a suitable precision track by an intermediate horizontally moveable arm 72 that moves in the directions of arrows 79. Intermediate horizontally moveable arm 72 is supported on a suitable precision track on a base 86 that is attached to and carried vertically upward or downward by belt 61A. Base 86 includes a drive motor 84 which drives a right angle transmission 83. Transmission 83 drives a pinion gear 82 which engages a rack gear 81 on horizontally moveable intermediate arm 72. Therefore, as motor 84 operates, it causes intermediate horizontally moveable arm 72 to move in one of the directions indicated by arrow 79.

A second rack gear 78 is attached to the upper surface of base 86. A pinion gear 79 is rotatably supported on horizontally moveable intermediate arm 72, causing it to rotate as intermediate horizontally moveable arm 72 moves in the direction of one of arrows 79 as a result of operation of motor 84. A pulley 76 is mounted axially with and attached to pinion gear 77. Pulley 76 carries a belt 74 which is also supported by an idler pulley 75 at the opposite end of horizontally moveable intermediate arm 72. A coupler 73 connects a point on belt 74, which moves in one of the directions of arrows 80, to horizontally moveable arm 51A, causing it to move in one of the directions of arrows 22 in response to operation of motor 84.

Rotary encoder 85 provides 10,000 equally spaced counts per inch of movement of horizontally moveable arm 51A in the direction of arrows 22, and sends signals indicative of the position of horizontally moveable arm 51A to microcontroller 29, which then generates control signals to control motor 84 via one of conductors 29B.

The structure and operation of Y-drive mechanism 50B are essentially identical to those of Y-drive mechanism 50A.

Referring to FIGS. 1A–1C and 2A–2C, rods 52A and 52B rotate to cause wafer boat edge engaging members 45A and 45B to pivot so as to engage edge support rails 24B and 24C of opposite edges of each wafer boat 24, as indicated by arrows 55 and 56 in FIGS. 1B and 1C. The wafer boat support rails 24B and 24C of each wafer boat 24 can be placed directly on V-shaped intersections formed by boat edge-support arms 53C,53D of edge engaging member 53 and V-shaped intersections formed by boat edge support arms 54C,54D. The outer ends of boat edge-support arms 53D are stabilized by member 53B, and the outer edges of boat edge support arms 54D are stabilized by member 54B.

The V-shaped intersections formed by boat edge-support arms 53C,53D and boat edge-support arms 54C,54D ensure that the wafer boats 24 are accurately aligned with horizontally moveable arms 51A and 51B when the wafer boat support rails 24B and 24C rest in the V-shaped intersections.

Microcontroller 29 then causes motor assembly 64 of FIG. 1D to operate belts 61A and 61B to raise the horizontal translation devices 50A and 50B and the up to eight loaded wafer boats 24 supported thereby to a level slightly above that of a "destination" cantilever paddle 47, with the wafer boat edge-support arms remaining in the boat-supporting configuration indicated by the solid lines in FIGS. 1B and 1C.

Figure 2A:
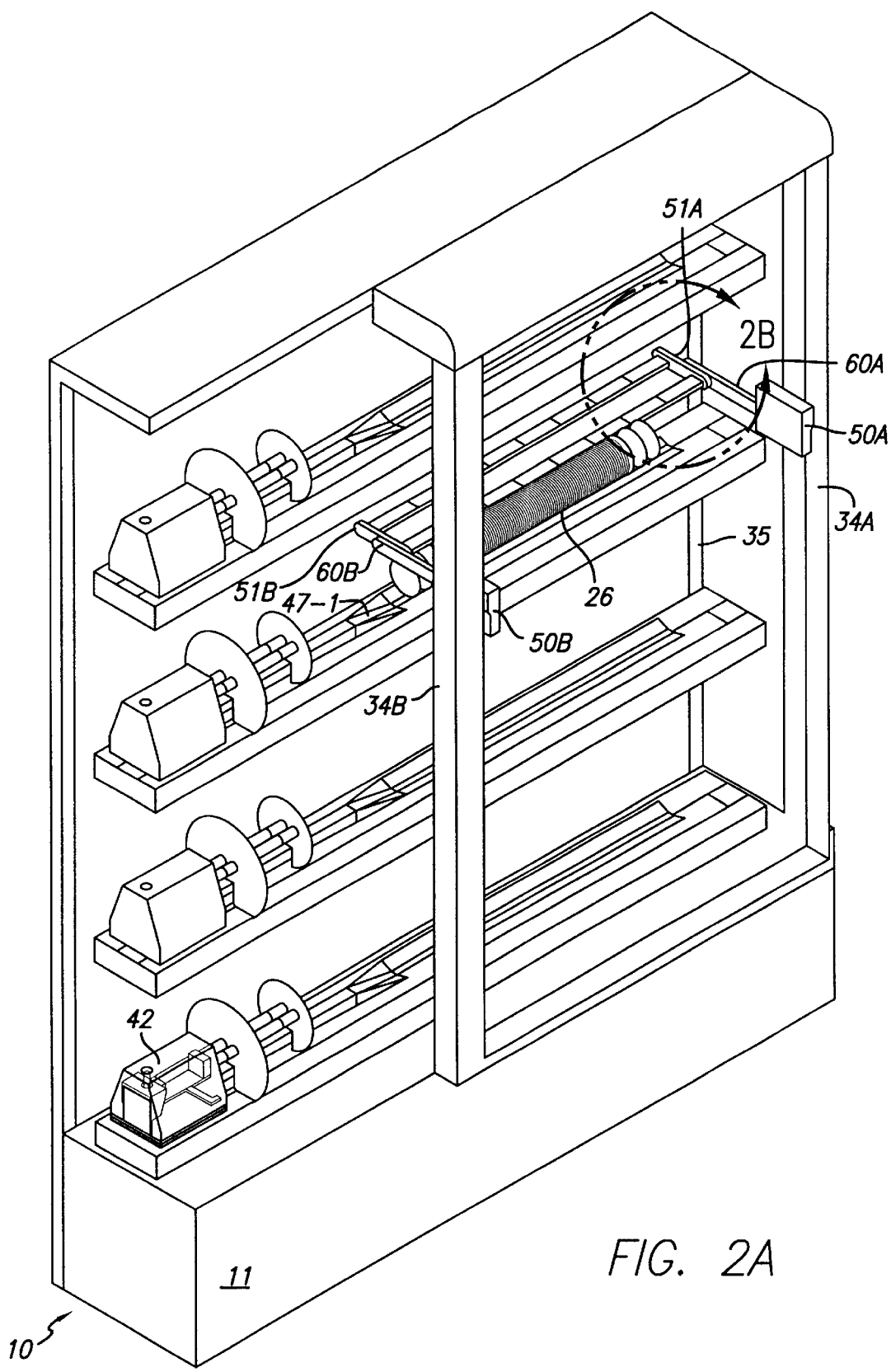
FIG. 2A is a perspective view of the system of FIG. 1 showing a mechanism positioned to lift a plurality of boatloads of wafers from a silicon carbide cantilever paddle.
Figure 2B:
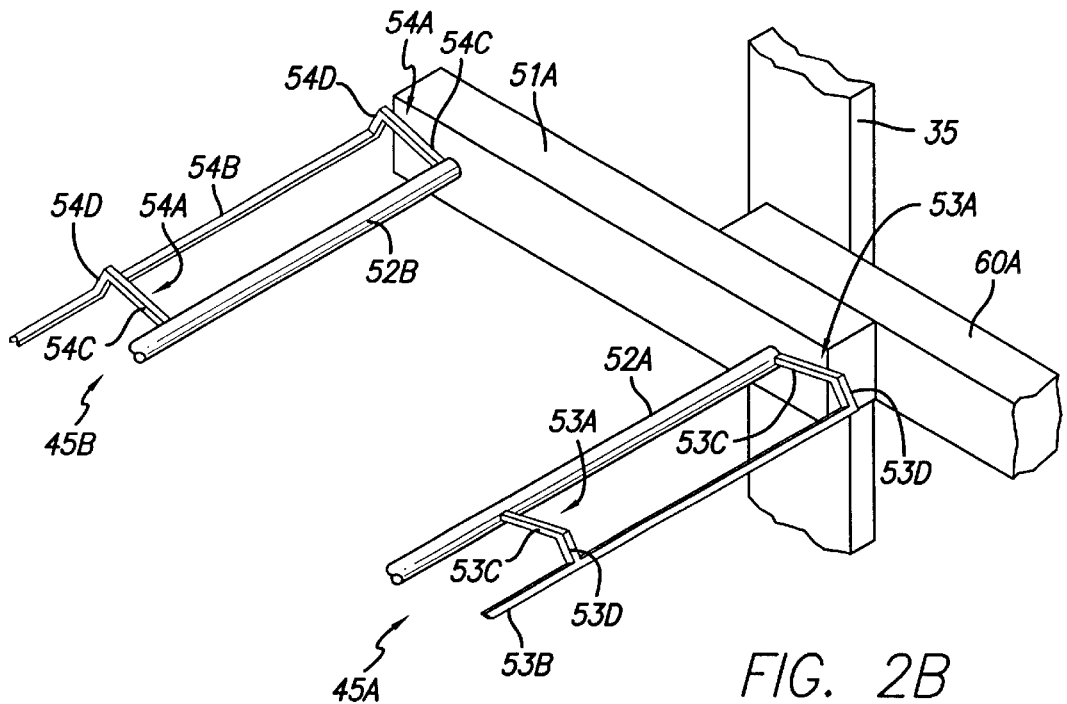
FIG. 2B is an enlarged perspective view of a portion of the system as shown in FIG. 2A.

Next, microcontroller 29 operates to move horizontally moveable arms 51A and 51B and the loaded wafer boats supported thereby over the destination cantilever paddle, for example cantilever paddle 47-1, as shown in FIG. 2A. Microcontroller 29 also adjusts for any needed offset correction as previously described to ensure that the wafer boats are precisely aligned with the longitudinal axis of cantilever paddle 47-1. Control software of the system 29 causes horizontal translation mechanisms 50A and 50B to perfectly align the up to eight boatloads of wafers over the cantilever paddle 47, and then gently lower them onto cantilever paddle 47 without any abrasion. This is important because it prevents generation of microscopic particulates which, if present, cause imperfections on the integrated circuits being formed and thereby reduce processing yields. Microcontroller 29 then operates motor assembly 64 of FIG. 1D to gently rest the wafer boats 26 onto cantilever paddle 47-1.

Figure 2C:
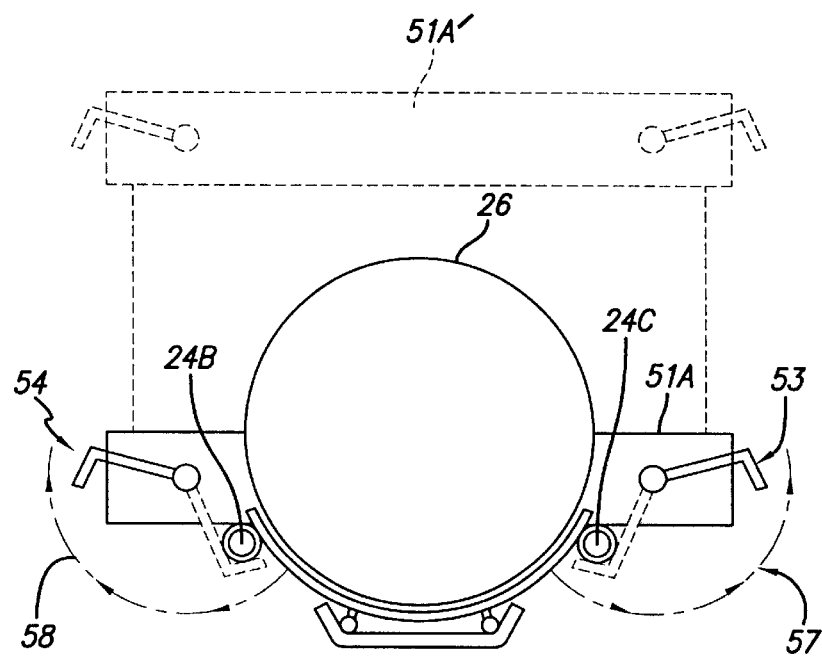
FIG. 2C is a partial section view useful in describing the operation of unloading a plurality of boatloads of wafers from a paddle as shown in FIG. 2A.

Microcontroller 29 then rotates rods 52A and 52B to pivot edge-support arms 53C,53D and 54C,54D so they swing clear of wafer boats 24, as indicated by arrows 57 and 58 in FIG. 2C. Microcontroller 29 then operates elevators 34A and 34B to raise horizontal translation mechanisms 50A and 50B so that horizontally moveable arms 51A and 51B, the wafer edge support mechanisms 53 and 54, and rods 52A and 52B completely clear wafers 26. Microcontroller 29 then operates the horizontal translation mechanisms 50A and 50B to horizontally withdraw moveable arms 51A and 51B to their "home" positions, and then operates elevators 34A and 34B to return horizontal translation mechanisms 50A and 50B to the home position to pick up another group of typically up to eight loaded standard wafer boats or a single long boat to be loaded onto another cantilever paddle 47.

After all of the wafers 26 have been loaded onto cantilever paddles 47, moved into corresponding furnace tubes, processed, and withdrawn by the various carriages 43, the wafer boat loading/unloading mechanism then is operated in the reverse order from that described above to remove each group of loaded wafer boats from the cantilever paddle 47 and return each group to the location shown in FIG. 1A. All of the wafer boats of each group then can be carried away by an operator, or, if available, an automated shuttle machine.

Figure 3:
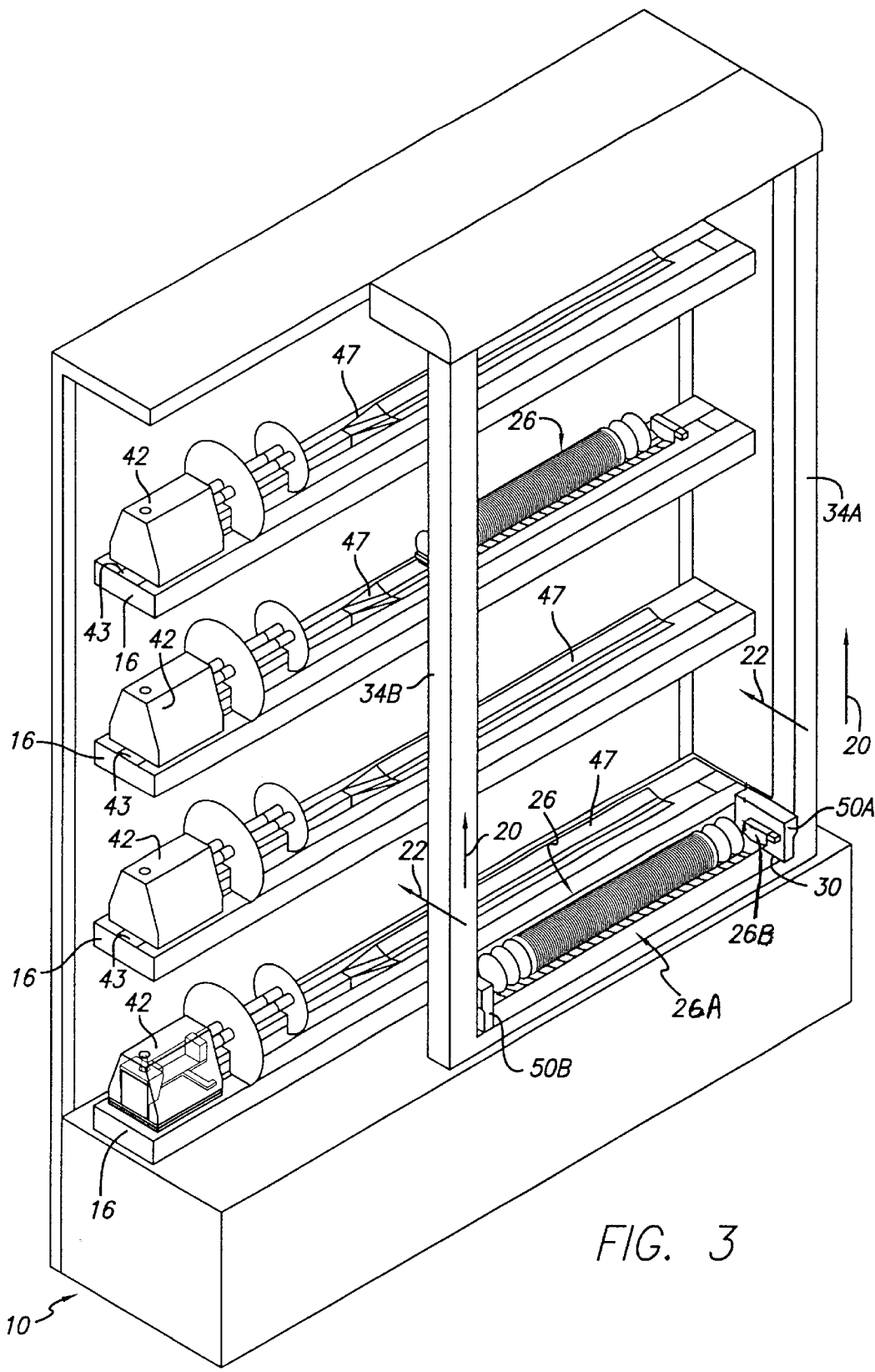
FIG. 3 is a diagram showing a plurality of boatloads of wafers supported by an intermediate carrier that is carried by the parallel Y-drive mechanisms.

Referring to FIG. 3, an intermediate silicon carbide carrier 26A is used instead of using above described wafer boat engaging mechanisms 52A and 52B of FIGS. 1A and 2A. Intermediate silicon carbide carrier 26A is provided with a hook end 26A that is supported by a receiving element 30 attached to the horizontally moveable arm (not shown) of horizontal translation mechanism 50A. A similar hook at the opposite end of intermediate carrier 26A is supported by a horizontally moveable arm of horizontal translation mechanism 50B. Typically, up to eight loaded standard wafer boats (or a long boat carrying 150 or 300 semiconductor wafers then are precisely aligned with and placed on intermediate carrier 26A. If a single long boat is used, its opposite ends can be provided with hook ends that are supported by receiving elements 30, in which case the intermediate carrier 26A is not used.

The vertical translation mechanisms in elevators 34A and 34B and the horizontal translation mechanisms 50A and 50B then operate as described above with reference to FIGS. 1A–G and FIGS. 2A–C to place intermediate carrier 26A and the loaded wafer boats therein onto cantilever paddle 47. After the horizontal translation mechanisms 50A–50B have been withdrawn from the vicinity of cantilever paddle 47, the carriage 42 moves to position cantilever paddle 47 with intermediate carrier 26 and the up to eight loaded wafer boats in the processing zone of an adjacent furnace tube.

An important advantage of the above described wafer loading system is that a queue mechanism of the type designated by numeral 30 in FIG. 1 of prior art U.S. Pat. No. 5,765,982 to load or unload individual wafer boats onto or off of a particular cantilever paddle is not used in the present invention. Instead, up to eight wafer boats are simultaneously loaded onto a cantilever paddle or are simultaneously unloaded from the cantilever paddle in the same amount of time required for loading or unloading a single wafer boat in the prior art wafer loading systems. The amount of time required for loading and unloading wafers into the diffusion furnace therefore is reduced by a factor of up to eight or more over the system shown in previously described U.S. Pat. No. 5,765,982.

Referring next to FIGS. 4A–4D, a horizontal wafer boat transport/handler system 100 includes a horizontal translation assembly 101 (see FIG. 4C) and a boat support assembly 102 carried by the moveable arms 51A and 51B of the above described horizontal transport mechanisms 50A and 50B, respectively. (Note that where convenient, the same reference numerals are used in FIGS. 4A–4D as in the earlier drawings, to designate the same or similar parts.)

Boat support assembly 102 is operable to carry a number of wafer boats 24 loaded with wafers 26 from a wafer boat nest 99 on a load platform 87 of horizontal translation assembly 101 along a horizontal path to a location (shown in FIG. 4C) immediately over cantilever paddle 47, and to allow the loaded wafer boats 24 to be gently lowered and deposited onto cantilever paddle 47.

Figure 1G:
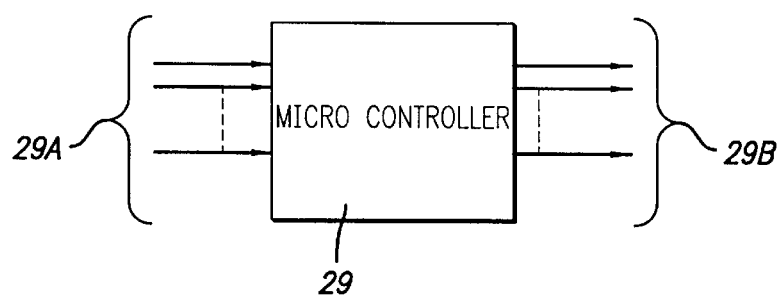
FIG. 1G is a block diagram of a programmed microcontroller connected to various sensors, actuators, motors, and switches involved in operation of the automatic wafer boat loading system of FIGS. 1A–F.

Boat support assembly 102 also is operable under control of microcontroller 29 of FIG. 1G to move clear of (i.e., avoid touching) the wafers 26 in all of the wafer boats 24 resting on cantilever paddle 47 as boat support assembly 102 is moved away from cantilever paddle 47 after the wafer boats 24 have been loaded on cantilever paddle 47. After boat support assembly 102 has been withdrawn from the vicinity of cantilever paddle 47, the wafer boats 24 thereon are moved by the carriage 16 supporting cantilever paddle 47 into a horizontal furnace tube (not shown) for wafer processing.

After the wafer processing is complete, cantilever paddle 47, wafer boats 24 and the processed wafers are withdrawn from the furnace tube. Boat support assembly 102 then is moved back over cantilever paddle 47 and then is operable to pick up all of the wafer boats 24 from cantilever paddle 47 and carry them and the processed wafers 26 back to a location immediately above load platform 87. Load platform 87 then is raised so as to support the wafer boats 24.

The above mentioned wafer boat nest 99 includes a wafer boat locating nest 93, a plurality of precisely positioned raised features 90, and a plurality of position adjustment slots 94. Screws (not shown) extending through position adjustment slots 94 into the supper surface 87A of load platform 87 to attach wafer boat nest 99 thereto. Load platform 87 rests on a thick support plate 103 that extends from plate 59B of mounting bracket 59 to plate 88B of mounting bracket 88.

Figure 4A:
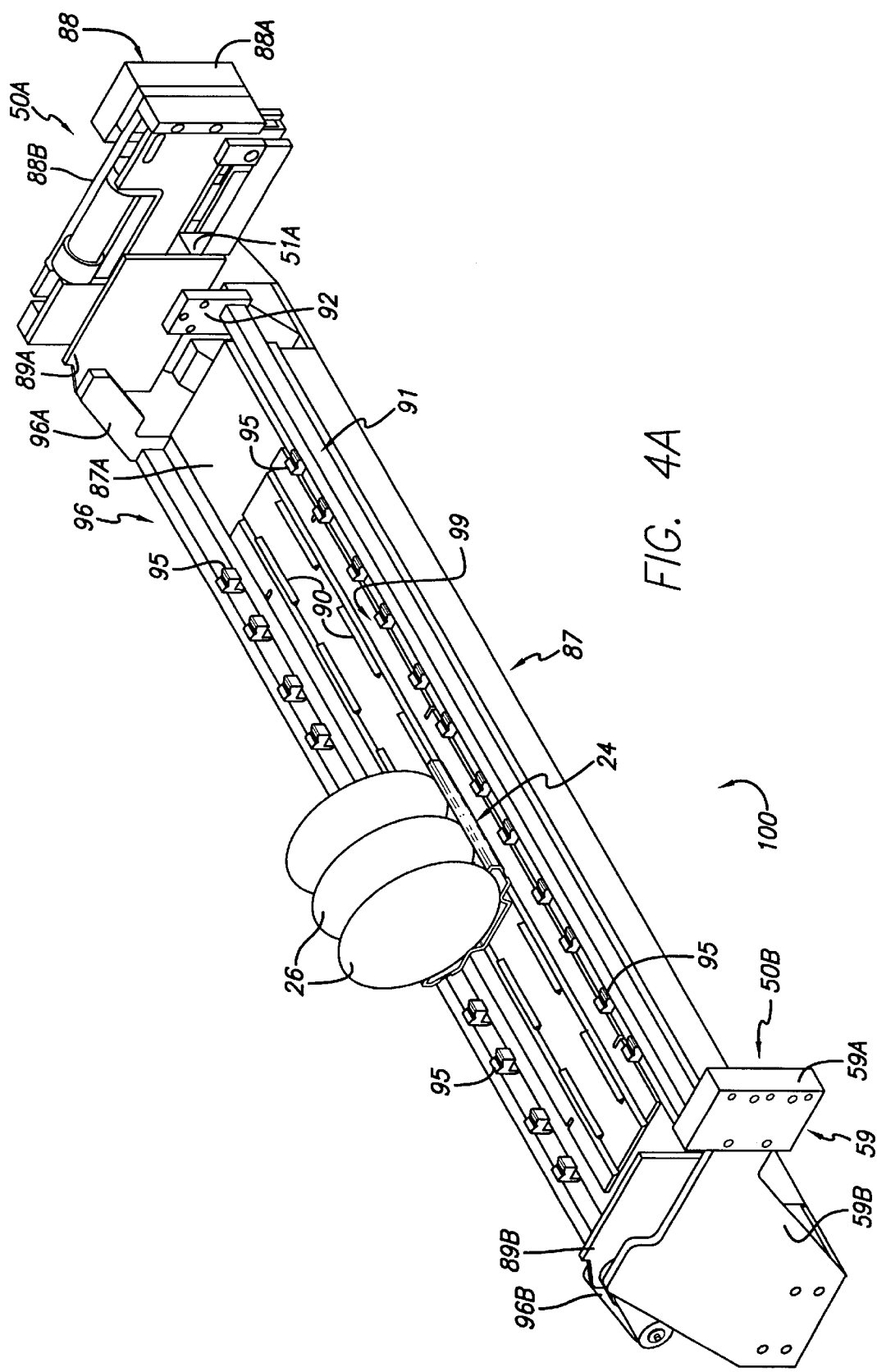
Figure 4B:
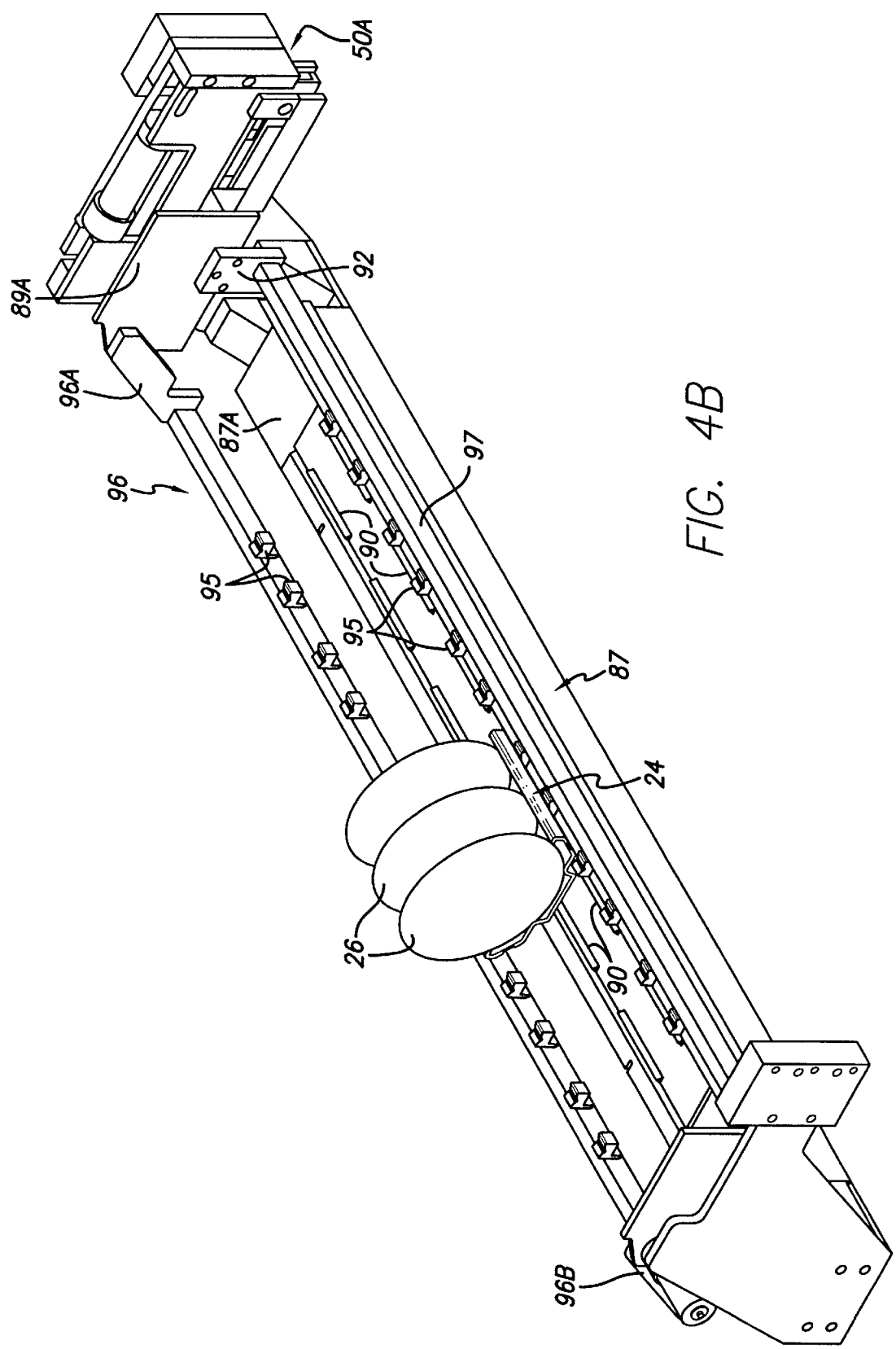

The drawing in FIG. 4B is essentially identical to the drawing in FIG. 4A, except that in FIG. 4B the upper surface 87A is lower than in FIG. 4A because the internal bladder 107 shown in subsequently described FIG. 5 has been deflated so as to lower surface 87A.

Figure 4C:
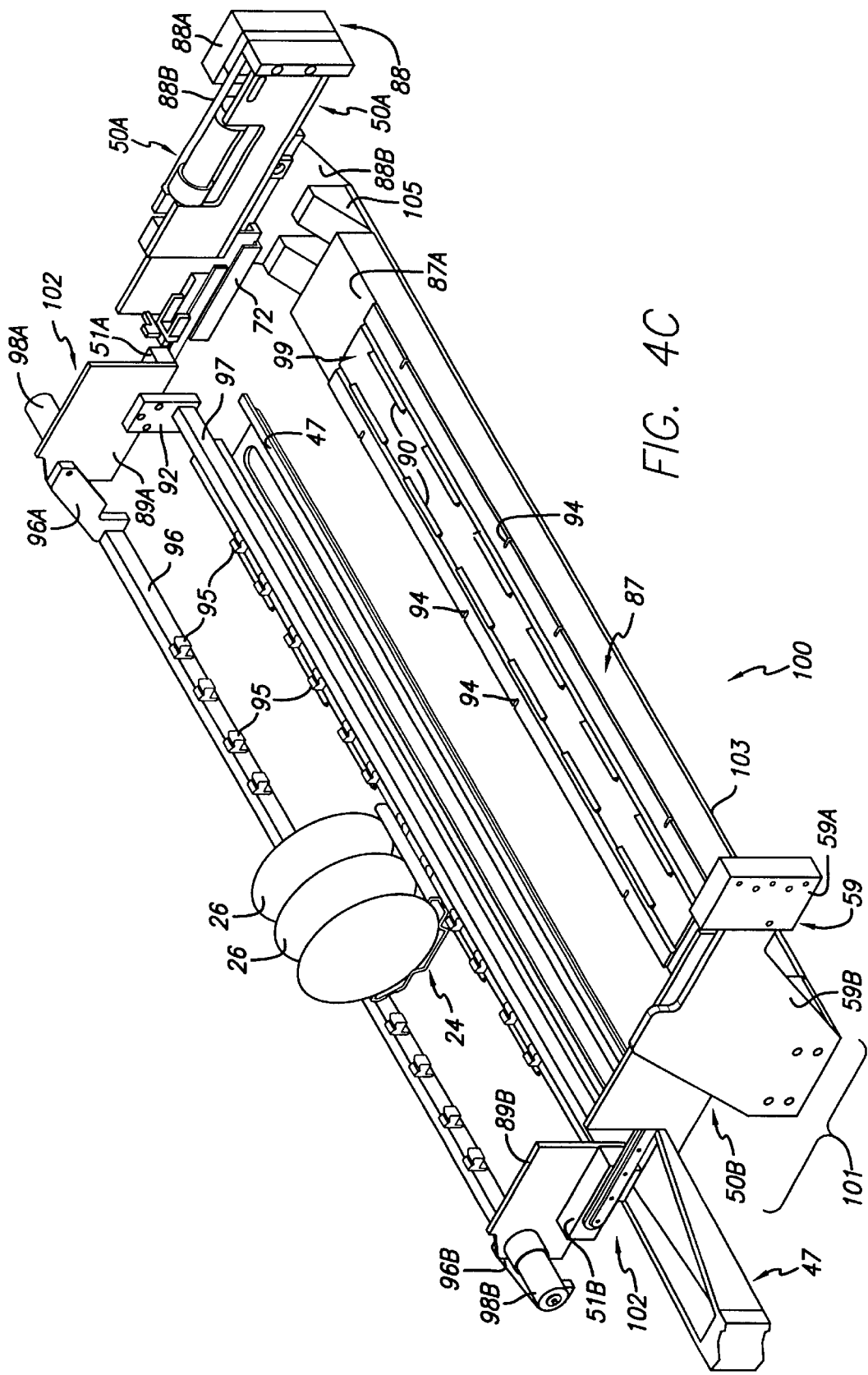
Figure 5:
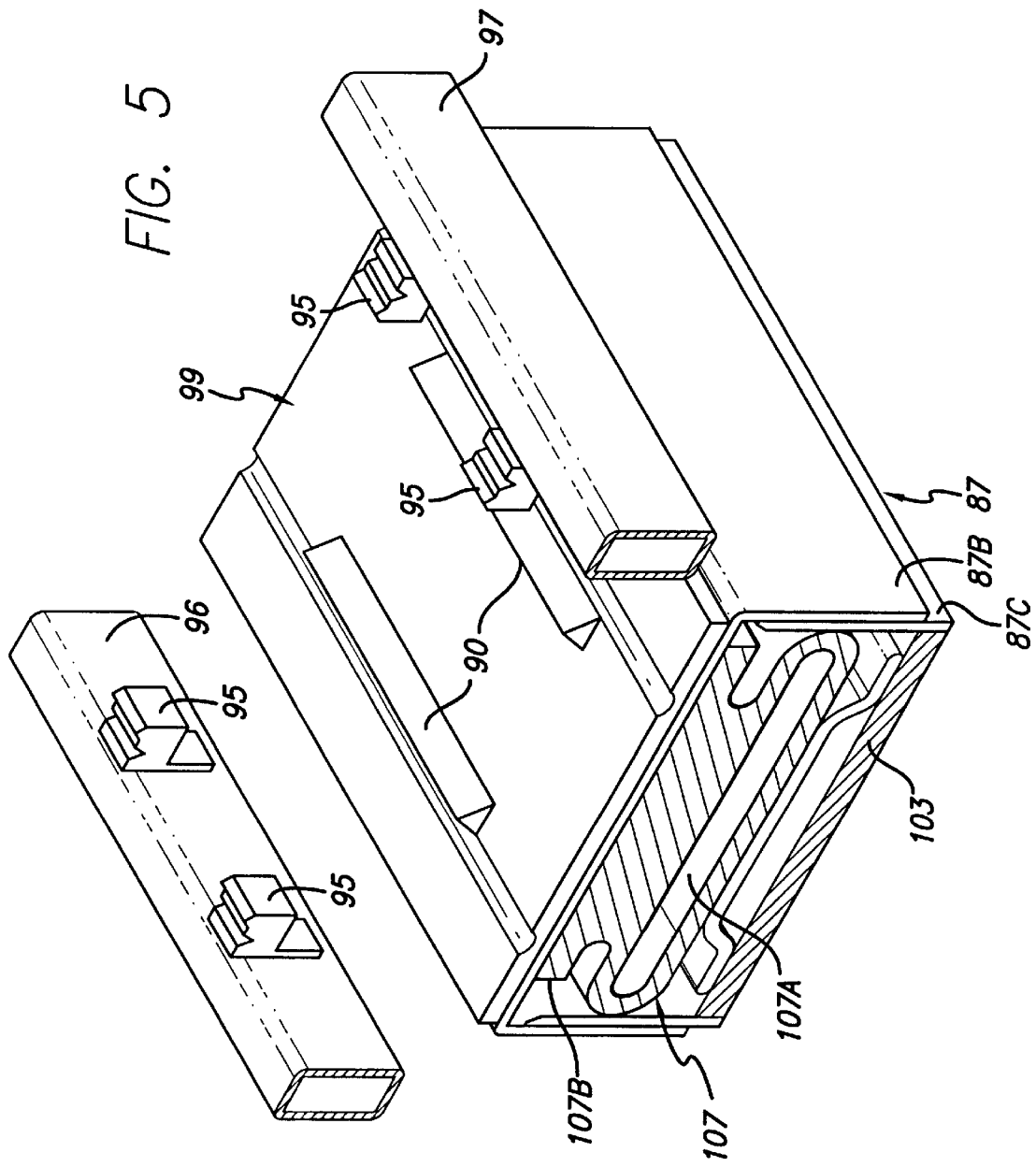
FIG. 5 is a partial perspective view of the load platform 87 of FIGS. 4A–D.

The upper surface 87A of load platform 87 can be precisely raised and lowered by means of an elongated, inflatable bladder and inflation pump as shown in FIG. 5 to allow wafer boat nest 99 to be lowered enough to clear the lowest portions of boat support assembly 102 and wafer boats 24 as wafer boats 24 are carried between load platform 87 and the location shown in FIG. 4C.

Referring to FIG. 5, load platform 87 includes a moveable outer inverted U-shaped section 87B which is "nested" over a stationary inner lower section 87C that is rigidly attached to support plate 103. Note that in FIGS. 4A–C the upper surface of U-shaped upper section 87B is designated by reference numeral 87A. The bladder 107 includes a hollow inflatable section 107A that can rest on a suitable platform supported by support plate 103. Hollow inflatable section 107A preferably directly supports the horizontal upper inner surface of outer section 87B, but bladder 107 can include an optional upper solid section 107B that supports the horizontal upper inner surface of outer section 87B. In any case, bladder 107 is inflated or deflated by a compressed air source controlled by microcontroller 29 of FIG. 1G to raise and lower wafer boat nest 99.

The control of raising and lowering outer section 87B and wafer boat nest 99 and wafer boats 24 thereon is very precise, and the structure shown in FIG. 4 is quite inexpensive.

Next, the structure of boat support assembly 102 will be described in detail. FIGS. 4B and 4C show wafer boats 24 supported by a stationary support rail 97 and a moveable support rail 96. FIG. 4C shows boat support assembly 102 precisely positioned and aligned directly above cantilever paddle 47. Stationary support rail 97 and moveable support rail 96 each include one or a plurality of rigid support tabs 95, which can be composed of suitable high temperature material such as ceramic, silicon carbide or polyamide. Some of the support tabs 95 are attached to the vertical inner face of stationary support rail 97, and the rest of support tabs 95 are attached to the inner vertical face of moveable support rail 96, as shown in FIGS. 4A–4C. Support tabs 95 directly engage the lower surfaces of the opposed support edges along either side of wafer boat 24 as to support it and wafers 26.

Stationary support rail 97 is attached by a pair of plates such as 92 in FIGS. 4A–4D to the inner face of a first support drive mounting plate 89A that is attached to horizontally moveable arm 51A of horizontal translation mechanism 50A and to the inner face of a second support drive mounting plate 89B supported by horizontally moveable arm 51B of horizontal translation assembly 50B.

Moveable support rail 96 is rigidly attached to the outer ends of a pair of rotary support arms 96A and 96B. The opposite ends of rotary support arms 96A and 96B are connected to axles (not shown) which are supported by and extend through support drive mount plates 89A and 89B, respectively, and are driven by DC servo motors 98A and 98B, respectively, which are controlled by microcontroller 29 of FIG. 1G.

In operation, wafer boats 24 loaded with wafers 26 initially are placed on wafer boat nest 99. The raised features 90 of wafer boat nest 99 ensure precise placements of the wafer boats 24 on load platform 87, and hence later on cantilever paddle 47, and still later within the furnace tube. Next, internal bladder 107 is precisely deflated under control of microprocessor 29, lowering the upper surface 87A of load platform 87 to the level shown in FIG. 4B so the opposed parallel support edges of the wafer boats 24 are supported by the finger tabs 95 on stationary rail 97 and moveable rail 96.

The vertical drives 34A and 34B (FIG. 4D) then are operated by microcontroller 29 to position the wafer boats 24 at a suitable vertical level relative to the particular cantilever paddle 47 onto which the wafer boats 24 are to be loaded.

Next, horizontal translation mechanisms 50A and 50B are operated to extend horizontal translation arms 51A and 51B to the position indicated in FIG. 4C. Note that the upper surface 87A of load platform 87 has been lowered enough to clear the wafer boats and the lowest portions of the boat support assembly 102 as it is moved from the position shown in FIG. 4B to the position shown in FIG. 4C. Wafer boats 24 then are gently lowered onto cantilever paddle 47, wherein the vertical translation mechanisms shown in FIG. 1D are actuated to lower horizontal translation assemblies 50A and 50B until the bottoms of the wafer boats 24 rest on cantilever paddle 47. Precise alignment of boat support assembly 102 and wafer boats 24 with cantilever paddle 47 is achieved by operating the microcontroller 29 to monitor the two horizontal rotary encoders 85 of horizontal translation mechanisms 50A and 50B, or alternatively, by means of sensors 70A and 70B such as those shown in FIG. 1F in the automated manner previously described herein.

The vertical drives of FIG. 1D then are operated to lower moveable support rail 96 and stationary support rail 97 enough to disengage it from the lower support edge surfaces of the wafer boats 24. As shown in FIG. 4D, rotary arms 96A and 96B and moveable support rail 96 then are rotated by DC servo motors 98A and 98B to lift moveable support rail 96 over wafers 26 in wafer boat 24, as shown. The horizontal translation mechanisms 50A and 50B then are actuated to move boat support assembly 102 away from the wafer boats 24 in cantilever paddle 47. Movable support rail 96 is lowered, and boat support assembly 100 to is returned to the home position.

Next, cantilever paddle 47 and wafer boats 24 thereon are moved horizontally by carriage 16 into the furnace tube, wherein the wafers 26 are processed. After the wafer processing is complete, cantilever paddle 47 and wafer boats 24 are withdrawn from the furnace tube. The horizontal wafer boat transport/handler system 100 then is operated under control of microcontroller 29 in the reverse order from that described above so as to engage the support edge surfaces of wafer boats 24 and lift them from cantilever paddle 47, return them to a position precisely over load platform 87 and wafer boat nest 99. Bladder 107 then is inflated under control of microcontroller 29 to raise load platform 87 enough to cause wafer boat nest 99 to support the wafer boats 24, so as to allow wafer boats 24 to be removed from load platform 87, either by a human operator or a robotic machine.

While the invention has been described with reference to several particular embodiments thereof, those skilled in the art will be able to make the various modifications to the described embodiments of the invention without departing from the true spirit and scope of the invention. It is intended that all elements or steps which are insubstantially different or perform substantially the same function in substantially the same way to achieve the same result as what is claimed are within the scope of the invention. For example, the belts and pulleys disclosed could be replaced by corresponding chains and sprockets. A different mechanism could be used for raising and lowering moveable rail 96.

What is claimed is:

1. An apparatus for automatically and simultaneously loading a plurality of wafer boats onto a cantilever paddle, and for automatically and simultaneously unloading the loaded wafer boats from the cantilever paddle, comprising:

(a) a stationary track aligned with a first opening of a furnace, and a first carriage moveable on the track, the first carriage supporting the cantilever paddle;

(b) a first vertical translation mechanism including a first stationary part and a first vertically moveable support, and a second vertical translation mechanism including a second stationary part and a second vertically moveable support;

(c) a first horizontal translation mechanism having a first base supported by the first vertically moveable support and a first horizontally moveable arm supported by the first base, and a second horizontal translation mechanism having a second base supported by the second vertically moveable support and a second horizontally moveable arm supported by the second base;

(d) a horizontal support apparatus adapted to support a plurality of wafer boats each loaded with semiconductor wafers, the horizontal support apparatus having a first end supported by the first horizontally moveable arm and a second end supported by the second horizontally moveable arm; and (e) a stationary wafer boat edge support member having a first end supported in fixed relationship to the first horizontally moveable arm and a second end supported in fixed relationship to the second horizontally moveable arm, and a moveable wafer boat edge support member having a first end supported in moveable relationship to the first horizontally moveable arm and a second end supported in moveable relationship to the second horizontally moveable arm, the moveable wafer boat edge support member including first and second end portions supported by outer ends of first and second rotary arms, respectively, having inner end portions supported by first and second rotary drive mechanisms attached in fixed relationship to the first and second horizontally moveable arms, respectively.

2. The apparatus of claim 1 wherein the first and second rotary drive mechanisms rotate the first and second rotary arms, respectively, to bring the moveable wafer boat edge support member into a lower first position to engage an edge of each of the wafer boats and to an upper second position above the wafers in the wafer boats to clear the wafers as the first and second horizontal translation mechanisms are withdrawn from the wafer boats after they are set on the cantilever paddle.

3. The apparatus of claim 2 wherein the first and second rotary drive mechanisms include first and second DC servo motors, respectively.

4. The apparatus of claim 3 wherein the stationary wafer boat edge support member includes a first stainless steel rail, and the moveable wafer boat edge support member includes a second stainless steel rail, the apparatus further including a plurality of support fingers rigidly attached to the first and second rails, respectively, for engaging wafer boat edge support surfaces of the wafer boats.

5. The apparatus of claim 4 wherein the support fingers are composed of high temperature material.

6. The apparatus of claim 2 including a load platform mechanism attached in fixed relationship to the first and second vertical translation mechanisms for receiving and supporting the wafer boats.

7. The apparatus of claim 6 wherein the load platform mechanism includes an upper surface plate that is moveable relative to a lower portion of the load platform mechanism so as to clear the horizontal support apparatus and wafer boats supported thereby as the wafer boats are carried between the cantilever paddle and the load platform mechanism.

8. The apparatus of claim 7 wherein the load platform mechanism includes an internal inflatable bladder disposed between the upper surface plate and the lower portion of the load platform mechanism and adapted to precisely control the elevation of the upper surface plate relative to the lower portion of the load platform mechanism.

9. A method of automatically loading at least one wafer boat onto a cantilever paddle, comprising:

(a) providing first and second vertical translation devices having first and second vertically moveable supports, respectively, and also providing a first horizontal translation device having both a first base attached to the first moveable support and a first horizontally moveable arm, and a second horizontal translation device having both a second base attached to the second moveable support and a second horizontally moveable arm;

(b) supporting a first end of a horizontal support apparatus adapted to support a plurality of wafer boats each loaded with semiconductor wafers by means of the first horizontally moveable arm, and supporting a second end of the horizontal support apparatus by means of the second horizontally moveable arm;

(c) positioning a stationary wafer boat edge support member so it can engage a first edge of the wafer boat, and positioning a moveable boat edge support member so it can engage a second edge of the wafer boat;

(d) lowering a platform supporting the wafer boat so the first and second edges of the wafer boat rest on the stationary wafer boat edge support member and the moveable wafer boat edge support member, respectively, so the wafer boat can clear the platform during step (e);

(e) operating the first and second horizontal translation devices to move the first and second horizontally moveable arms to first and second positions, respectively, proximate to the cantilever paddle;

(f) lowering the wafer boat onto the cantilever paddle; and (g) raising the moveable wafer boat edge support member higher than the tops of the wafers, and horizontally retracting the horizontal support apparatus so the stationary and moveable wafer boat edge support members clear the first and second edges of the wafer boat.

10. The method of claim 9 including horizontally moving the cantilever paddle and wafer boat and wafers thereon into a furnace for wafer processing, returning the cantilever paddle, wafer boat and wafers from the furnace when wafer processing is complete, then operating the first and second horizontal translation devices so as to move the horizontal support apparatus, with the moveable wafer boat edge support member in its raised position so the stationary wafer boat edge support member is positioned to engage the second edge of the wafer boat, lowering the moveable wafer boat edge support member so it is positioned to engage the second edge of the wafer boat, operating the first and second vertical translation devices to lift the wafer boat from the cantilever paddle by the first and second edges of the wafer boat, and operating the first and second horizontal translation devices to carry the wafer boat and processed wafers over the platform.

11. The method of claim 10 including raising the platform so as to lift the wafer boat so as to raise the first edge of the wafer boat above the stationary wafer boat support member and to raise the second wafer boat edge above the moveable wafer boat edge support member, and raising the moveable wafer boat edge support member to its raised position so as to allow the wafer boat and processed wafers thereon to be removed from the platform.

12. The method of claim 11 wherein the lowering and raising of the platform is performed by deflating and inflating, respectively, a bladder mechanism supporting the platform.

13. An apparatus for automatically and simultaneously loading a plurality of wafer boats onto a cantilever paddle, and for automatically and simultaneously unloading the loaded wafer boats from the cantilever paddle, comprising:

(a) a track aligned with a first opening of a furnace, and a first carriage moveable on the track, the first carriage supporting the cantilever paddle;

(b) a first vertical translation mechanism including a first stationary part and a first vertically moveable support, and a second vertical translation mechanism including a second stationary part and a second vertically moveable support;

(c) a first horizontal translation mechanism having a first base supported by the first vertically moveable support and a first horizontally moveable arm supported by the first base, and a second horizontal translation mechanism having a second base supported by the second vertically moveable support and a second horizontally moveable arm supported by the second base;

(d) a horizontal support apparatus adapted to support a plurality of wafer boats each loaded with semiconductor wafers, the horizontal support apparatus having a first end supported by the first horizontally moveable arm and a second end supported by the second horizontally moveable arm;

(e) a first wafer boat edge support member having a first end supported by the first horizontally moveable arm and a second end supported by the second horizontally moveable arm, and a second wafer boat edge support member having a first end supported by the first horizontally moveable arm and a second end supported by the second horizontally moveable arm; and (f) a load platform mechanism for receiving and supporting the wafer boats, the load platform mechanism including an upper surface that is moveable relative to a lower portion of the load platform mechanism so as to clear the horizontal support apparatus and wafer boats supported thereby as the wafer boats are carried between the cantilever paddle and the load platform mechanism, the load platform mechanism including an internal inflatable bladder disposed between the upper surface and the lower portion of the load platform mechanism and adapted to precisely control the elevation of the upper surface plate relative to the lower portion of the load platform mechanism in response to inflation/deflation of the bladder.

* * * * *